(12) United States Patent
Katoh et al.

(10) Patent No.: US 10,794,962 B2
(45) Date of Patent: Oct. 6, 2020

(54) SYSTEMS AND METHODS FOR BATTERY MICRO-SHORT ESTIMATION

(71) Applicant: TOYOTA MOTOR EUROPE, Brussels (BE)

(72) Inventors: Yuki Katoh, Brussels (BE); Keita Komiyama, Evere (BE)

(73) Assignee: TOYOTA MOTOR EUROPE, Brussels (BE)

( * ) Notice: Subject to any disclaimer, the term of this patent is extended or adjusted under 35 U.S.C. 154(b) by 184 days.

(21) Appl. No.: 16/076,458

(22) PCT Filed: Feb. 19, 2016

(86) PCT No.: PCT/EP2016/053597
§ 371 (c)(1),
(2) Date: Aug. 8, 2018

(87) PCT Pub. No.: WO2017/140382
PCT Pub. Date: Aug. 24, 2017

(65) Prior Publication Data
US 2019/0049524 A1    Feb. 14, 2019

(51) Int. Cl.
*G01R 31/392*    (2019.01)
*H01M 10/44*    (2006.01)
(Continued)

(52) U.S. Cl.
CPC ......... *G01R 31/392* (2019.01); *G01R 31/382* (2019.01); *G01R 31/389* (2019.01);
(Continued)

(58) Field of Classification Search
USPC ................... 324/426, 431, 432, 441
See application file for complete search history.

(56) References Cited

U.S. PATENT DOCUMENTS

2001/0028238 A1    10/2001    Nakamura et al.
2007/0252601 A1    11/2007    Satoh et al.
(Continued)

FOREIGN PATENT DOCUMENTS

FR    2968769 A1    6/2012
JP    2000-299137 A    10/2000
(Continued)

OTHER PUBLICATIONS

Nov. 14, 2016 International Search Report issued in International Patent Application No. PCT/EP2016/053597.
Nov. 14, 2016 Written Opinion issued in International Patent Application No. PCT/EP2016/053597.

*Primary Examiner* — Vincent Q Nguyen
(74) *Attorney, Agent, or Firm* — Oliff PLC

(57) ABSTRACT

A system for determining a battery condition includes a temperature sensor configured to provide a temperature value associated with the battery, an impedance sensor configured to provide impedance information associated with the battery, and a controller. The controller is configured to determine a threshold impedance associated with a separator membrane of the battery based on an initial impedance of the separator membrane as measured by the impedance sensor and a battery temperature as measured by the temperature sensor, monitor, during operation of the battery, an actual impedance associated with the separator membrane of the battery based on the impedance information and the battery temperature, permit current flow to and from the battery when actual impedance is greater than the threshold impedance, and prevent current flow to and from the battery when the actual impedance is less than or equal to the threshold impedance.

16 Claims, 4 Drawing Sheets

(51) Int. Cl.
*H01M 10/48* (2006.01)
*H01M 10/0525* (2010.01)
*H01M 10/42* (2006.01)
*G01R 31/389* (2019.01)
*G01R 31/396* (2019.01)
*G01R 31/382* (2019.01)
*G01R 31/3842* (2019.01)
*H02J 7/00* (2006.01)

(52) U.S. Cl.
CPC ....... *G01R 31/3842* (2019.01); *G01R 31/396* (2019.01); *H01M 10/0525* (2013.01); *H01M 10/425* (2013.01); *H01M 10/443* (2013.01); *H01M 10/486* (2013.01); *H02J 7/0026* (2013.01); *H01M 2010/4271* (2013.01)

(56) References Cited

U.S. PATENT DOCUMENTS

| | | | |
|---|---|---|---|
| 2010/0221630 A1* | 9/2010 | Kajiwara | H01M 8/04313 429/443 |
| 2013/0169038 A1* | 7/2013 | King | B60L 58/18 307/10.1 |
| 2015/0125763 A1* | 5/2015 | Zheng | H01M 2/40 429/405 |
| 2015/0338471 A1 | 11/2015 | Ichikawa et al. | |

FOREIGN PATENT DOCUMENTS

| | | |
|---|---|---|
| JP | 2005-091217 A | 4/2005 |
| JP | 2014-206442 A | 10/2014 |

\* cited by examiner

SYSTEMS AND METHODS FOR BATTERY MICRO-SHORT ESTIMATION

FIELD OF THE DISCLOSURE

The present disclosure is related to systems and methods for determination of whether to allow operation of, i.e., current flow to and from, a battery. More particularly, the present disclosure is related to determination of a micro-short circuit in a battery that may require stopping of battery operation.

BACKGROUND OF THE DISCLOSURE

Rechargeable batteries, also called secondary cells, have become increasingly important as energy stores, in particular for vehicles. Such vehicles may be hybrid vehicles comprising an internal combustion engine and one or more electric motors or purely electrically driven vehicles.

A suitable rechargeable battery for such a vehicle may be a solid-state bipolar battery or other, e.g. liquid type batteries, in particular a laminated Li-ion battery. The rechargeable battery may be realized by a single cell or it may include a set of identical cells. In the latter case the battery is also called a battery pack.

A relevant characteristic of a battery is its capacity. A battery's capacity is the amount of electric charge it can deliver at a rated voltage. The more electrode material contained in the battery the greater is its capacity. The capacity is measured in units such as amp-hour (A·h).

The battery or the battery pack may include a control device for controlling charging and/or discharging. The control device monitors state of charge (SOC) of the battery and generally allows the battery to operate within its safe operating area. Such a battery or battery pack is also called a smart battery/smart battery pack. It is also possible that the control device is provided by the vehicle.

One important aspect of charge control is to assure that any overcharging and/or over-discharging of the battery is avoided. For this purpose the battery voltage may be monitored, which is increasing during charging. In case the determined battery voltage exceeds a predetermined upper voltage limit, it is recognized by the control device that the battery is fully charged and charging is stopped.

However, during the lifetime of a battery the charging and discharging procedures may lead to a degradation of the laminated layers of the battery. In particular a separator membrane present within the electrolyte between the anode and the cathode of the battery. The degradation can lead to internal micro-short circuits of battery, which in turn increases the risk of problems with the battery during operation (e.g., thermal runaway).

US 2001/0028238 discloses that the internal impedance related value which is related to the internal impedance of a secondary battery is compared with a previously obtained relation between the internal impedance related value and battery condition to judge the battery condition of the secondary battery. Since the internal impedance related value is a value related to the internal impedance which closely depends on the battery condition, the battery condition can be judged in detail based on such a relation.

However, in the above technology a semi-circular portion of a Nyquist plot are utilized, this portion including many additional factors of impedance that may not be related to micro-short circuits present in the separator membrane. Therefore, state of charge (SOC), type of deterioration of the battery, and temperature have an impact on the values and the technique of US 2001/0028238 may not yield results with a desired amount of accuracy.

SUMMARY OF THE INVENTION

The inventors of the present invention desire to enable more accurate detection of micro-shorts resulting from degradation of a separation membrane within a battery pack while simplifying structure and procedure.

Therefore, according to embodiments of the present disclosure, a system for determining a battery condition is provided. The system includes temperature sensing means configured to provide a temperature value associated with the battery, impedance measuring means configured to provide impedance information associated with the battery, and a controller. The controller is configured to determine a threshold impedance associated with a separator membrane of the battery based on an initial impedance of the separator membrane as measured by the impedance measuring means and a battery temperature as measured by the temperature sensing means, monitor, during operation of the battery, an actual impedance associated with the separator membrane of the battery based on the impedance information and the battery temperature, permit current flow to and from the battery when actual impedance is greater than the threshold impedance, and prevent current flow to and from the battery when the actual impedance is less than or equal to the threshold impedance.

By providing a system according to the present disclosure, the inventors have made it possible to more accurately detect a micro-short circuit in a battery and stop operation of the battery to prevent conditions undesirable for battery operation. This may in turn improve battery safety and life.

The impedance information may include an impedance spectrum, preferably in a Nyquist format.

The initial impedance may be measured in advance over a range of temperatures for a given equilibrium constant, and the measured values stored in a data map.

The threshold impedance may be further determined based on the values stored in the data map.

The controller may be configured to account for degradation of the battery based at least on a temperature frequency of the battery.

By taking into account degradation over time of the battery, it becomes possible to avoid erroneous indications of a battery fault, and therefore, the battery may be used safely to its maximum potential.

The threshold impedance may be reduced based on a degradation coefficient.

The degradation coefficient may be determined in advance by measuring degradation of an exemplary battery under exemplary use conditions, and at a plurality of temperature frequency values, the measured degradation being correlated to temperature frequency in a data map.

The battery may be at least one of a lithium-ion solid-state battery and a lithium-ion liquid electrolyte battery.

According to further embodiments of the present disclosure, a vehicle comprising the system according to the above described features may be provided.

According to still further embodiments of the present disclosure, a method for controlling a battery is provided. The method includes determining a battery temperature, determining a threshold impedance associated with a separator membrane of the battery based on an initial impedance of the separator membrane and the battery temperature, monitoring, during battery operation, an actual impedance associated with the separator membrane of the battery based on the impedance information and the battery temperature, permitting current flow to and from the battery when actual impedance is greater than the threshold impedance, and preventing current flow to and from the battery when the actual impedance is less than or equal to the threshold impedance.

In the method, the determining a threshold impedance may include analyzing an impedance spectrum to determine the initial impedance of separator membrane.

The initial impedance of the separator membrane may be determined from the impedance spectrum at a point where an impedance measurement crosses the real axis.

The method may include measuring the initial impedance in advance over a range of temperatures for a given equilibrium constant, and storing the measured values in a data map.

The threshold impedance may further be determined based on the values stored in the data map.

The method may further include accounting for degradation of the battery based at least on a temperature frequency of the battery.

The threshold impedance may be reduced based on a degradation coefficient.

The degradation coefficient may be determined in advance by measuring degradation of an exemplary battery under exemplary use conditions, and at a plurality of temperature frequency values, the measured degradation being correlated to temperature frequency in a data map.

The battery comprises at least one of a lithium-ion solid-state battery and a lithium-ion liquid electrolyte battery.

Additional objects and advantages of the invention will be set forth in part in the description which follows, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the disclosure.

DESCRIPTION OF THE EMBODIMENTS

Reference will now be made in detail to the present exemplary embodiments of the disclosure, examples of which are illustrated in the accompanying drawings. Wherever possible, the same reference numbers will be used throughout the drawings to refer to the same or like parts.

Figure 1:
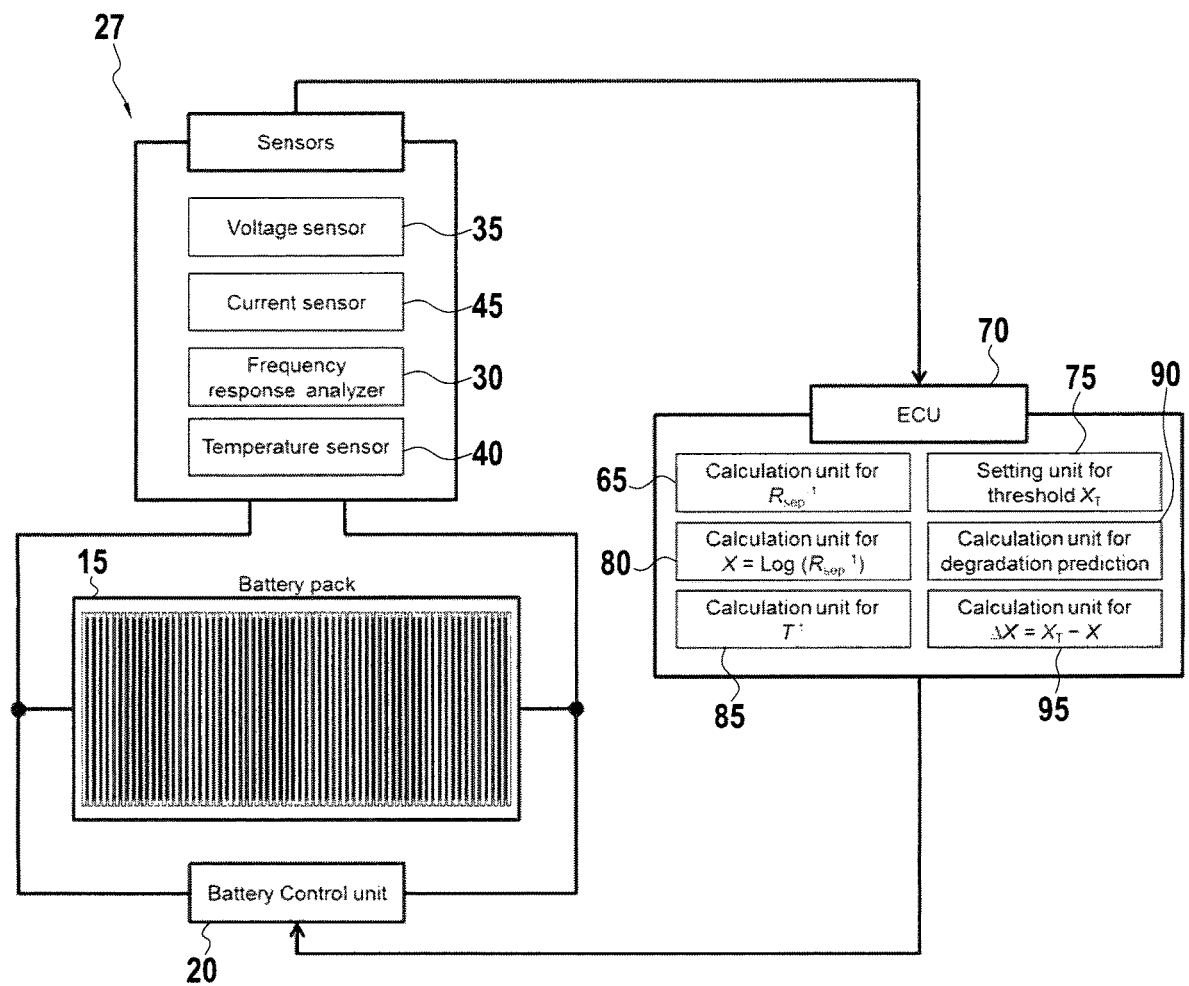
FIG. 1 is a schematic diagram of a system for monitoring a battery condition according to embodiments of the present disclosure.

FIG. 1 is a schematic diagram of a system for monitoring a battery condition according to embodiments of the present disclosure. The system may include a battery pack 15, one or more sensors 27, ECU 70, and a charging control unit 20. Battery pack 15 may include one or more battery cells 10, and a dummy cell (not shown), among others. Battery pack 15 may be any suitable type of battery, for example, a lithium ion battery, a NiMH battery, lead acid battery, etc.

Battery controller 20 may comprise any suitable battery controller configured to control operational processes of battery pack 15, e.g., charging the battery cells 10, discharging battery cells 10, etc.

As one of skill in the art understands, lithium ion batteries in particular require relatively strict charging and discharging circumstances to be maintained during a battery charging and discharging in order to avoid dangerous conditions such as overheating and overcharging. Therefore, battery controller 20 may be configured to control current and voltage flowing to and from battery pack 15 during charging and discharging, among others. For example, when it is determined that a micro-short has occurred, battery controller 20 may prevent battery pack 15 from operating.

Battery pack 15 may be connected to an inverter (not shown) which may in turn be connected to one or more motors, to permit energy stored in battery pack 15 during a charging process to be stepped up by the inverter and fed to the motor during a discharging process, thereby resulting in movement of the vehicle.

Each battery cell 10 may include an anode, a cathode, an electrolyte, and a separator membrane in the electrolyte separating the anode and cathode, among others. Battery cells 10 may be stacked (e.g., in a bi-polar fashion) within a housing associated with battery pack 15 to form battery pack 15. For example, battery pack 15 may include a housing configured to have one or more battery cells 10 stacked and connected therein.

Each battery cell 10 present in battery pack 15 may be connected in series or in parallel to other battery cells 10 present in battery pack 15. One of skill in the art will recognize that various criteria such as a desired voltage, a desired maximum current, etc. may be considered when designing a battery and connections as described herein.

Battery pack 15 may include one or more dummy cells (not shown) conductively linked to battery cells 10 to permit measurement of an open circuit voltage $V_{ocv}$ across the totality of battery cells 10 present within battery pack 15 by voltage sensor 35. For example, a dummy cell configured to provide a dummy load may be connected in parallel with each of battery cells 10 present within battery pack 15, and the output (i.e., open circuit voltage) may be provided to sensor bank 27, and more particularly voltage sensor 35. One of skill in the art will recognize that more than one dummy cell may be provided, for example one dummy cell for each battery cell 10 present in battery pack 15.

A number of sensors 27 may be provided with battery pack 15, including, for example, voltage sensor 35, a frequency response analyzer 30 configured to analyze a frequency response battery pack 15, a current sensor 45 configured to obtain current flow information to and from battery pack 15, temperature sensor 40 configured to sense a temperature of battery pack 15, etc. One or more of these sensors 27 be located within the battery pack itself and/or directly linked to elements of battery pack 15 enabling respective measurements to be taken from battery pack 15.

Sensors associated with battery pack 15 may be configured to provide signals to sensor bank 27, thereby enabling sensor bank 27 to monitor information associated with battery pack 15 (e.g. open circuit voltage $V_{ocv}$, impedance spectrum, temperature, etc.) during operation of the battery, i.e., a charging and/or discharging process and to provide the information to battery ECU 70, among others.

According to some embodiments, a state of charge detector may also be provided and may be configured to receive current information from current sensor 45 as well as voltage information from voltage sensor 35 in order to determine a state of charge (SOC) of battery pack 15.

Values from sensor bank 27 may be provided to battery ECU 70, with battery ECU 70 providing command signals battery controller 20 (e.g. operational control commands). For example battery ECU 70 may include a impedance calculation unit 65 for determining a reciprocal of a impedance ($R_{sep}^{-1}$) of one or more separator membranes associated with battery cells 10, a threshold setting unit 75 for setting a threshold impedance $X_T$, a degradation prediction unit 90 for estimating an amount of degradation of each battery cell 10, a temperature corrected impedance calculation unit 80 for calculating temperature and degradation corrected impedance value of the separators, a reciprocal temperature calculation unit 85, and a difference determination unit 95 for determining whether a corrected impedance falls within an operational region of the battery 15 (i.e., whether a micro-short in one or more separator membranes has occurred).

Battery ECU 70 may include a memory configured to store values obtained from sensor bank 27, among others. For example, battery ECU 70 may store voltage values obtained from voltage sensor 35, temperature values obtained from temperature detector 40, frequency response data received from frequency response analyzer 30, current flow data received from current sensor 45, etc., as well as map values associated with data experimentally obtained from an exemplary battery design corresponding to the battery pack 15 installed in the vehicle (e.g. degradation rate information, initial resistance/impedance values of separator membranes, etc.)

A history of values may be compiled and stored over the life of the battery pack 15 during use of the vehicle, and according some embodiments, when the vehicle is stored (i.e., not being driven). By compiling such data it may be possible to determine the history of temperatures, voltages, current flows, etc. to which battery pack 15 has been subjected, as well as an amount of time over which the battery was subject to each of said values. Such a history may be used to augment processes described below for determining certain values, for example, temperature frequency.

One of skill in the art will understand that the memory associated with battery ECU 70 may be comprised within battery ECU 70, or may be present on and or in other systems of the vehicle providing communication access to battery ECU 70, for example, within the battery pack 15 itself.

Once a battery pack 15 has been assembled and closed, for example, with a cover over the housing, an initial impedance $R_{sep\_initial}$ associated with the separator membranes of the battery pack 15 may be measured over a plurality of temperatures (e.g., −40 C to 600), and these impedance values stored in the memory associated with battery ECU 70. For example, these impedance values may be used to create a lookup data map that may be accessed during processing by ECU 70. Such a data map may be used throughout the life of battery pack 15 as a comparison to a current impedance of separator membranes, as described below.

Figure 2:
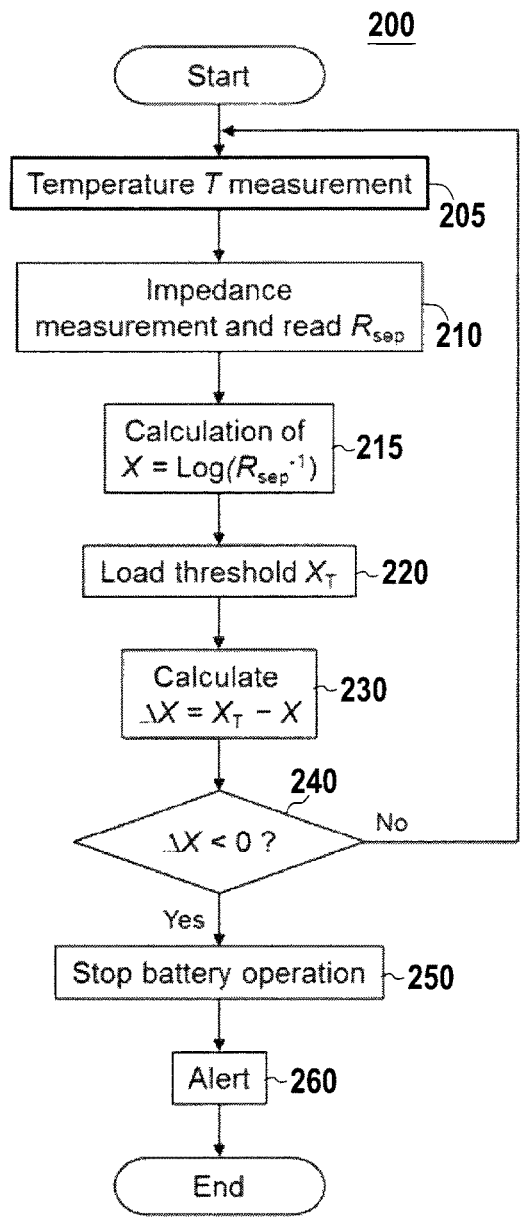
FIG. 2 is a flowchart showing one exemplary method for condition monitoring according to embodiments of the present disclosure.

FIG. 2 is a flowchart 200 showing an exemplary method for micro-short estimation according to embodiments of the present disclosure. At regular intervals (e.g., every 10 ms), battery ECU may obtain a temperature of battery pack 15 as determined by temperature detector 40 based on information provided by a temperature sensor associated with battery pack 15 (step 205).

Figure 3A:
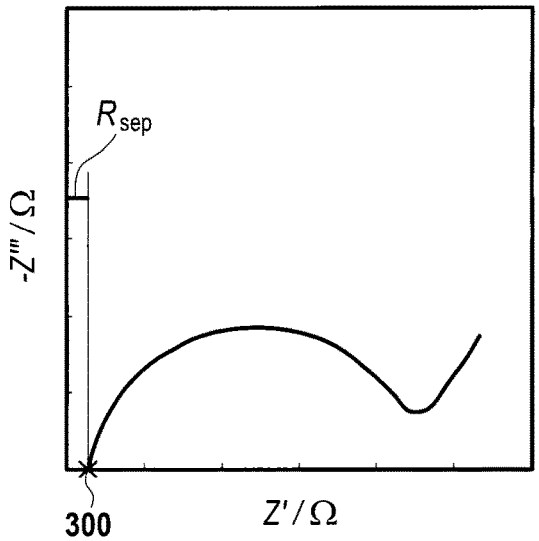
FIG. 3A is an exemplary Nyquist diagram showing an impedance spectrum of an exemplary battery.

An impedance spectrum associated with the battery pack 15 may then be obtained from, for example, frequency response analyzer 30, and separator impedance $R_{sep}$ determined (step 210). An exemplary data graph of a frequency response of an exemplary battery is shown at FIG. 3A. As shown at FIG. 3A the X axis corresponds to the real axis while the Y axis corresponds to the imaginary axis. A current separator impedance $R_{sep}$ associated with battery pack 15 can be determined by taking the value of the impedance Z at point 300, i.e., intersection of the impedance spectrum with the real axis. Alternatively, separator impedance $R_{sep}$ may be determined by measuring impedance of battery pack 15 at a predetermined frequency, i.e., the frequency corresponding to the left side of the semi-circle on the Cole-Cole plot shown at point 300 of FIG. 3A. As an example, a frequency of $10^5$ kHz can be used for a system employing sulfide electrolytes.

Regardless of the determination method for separator impedance $R_{sep}$, impedance calculation unit 65 may then calculate a reciprocal of separator impedance $R_{sep}$, i.e., $R_{sep}^{-1}$, and provide this value to temperature corrected impedance calculation unit 80.

Similarly, reciprocal temperature calculation unit 85 may receive current temperature T of battery pack 15 from temperature sensor 40 and calculate a reciprocal of this temperature (i.e., $T^{-1}$) for providing to temperature corrected impedance calculation unit 80.

Because $R_{sep}$ depends on temperature, a temperature corrected impedance value X is calculated according to the Arrhenius equation shown here at equation 1 (step 215).

$$X = \log(R_{sep}^{-1}) \propto T^{31\ 1} \tag{1}$$

Following calculation of the temperature corrected impedance value X, a threshold impedance value $X_T$ is calculated by threshold setting unit 75. Because there is a possibility of degradation of the battery 15, a degradation rate (i.e., a degradation coefficient) should be considered when preparing the threshold impedance value $X_T$ in order to provide more accurate results. Such a degradation rate depends on a calculated temperature frequency $T_x$ to which the battery pack 15 has been subjected over its lifetime. As noted above, because a temperature history of battery pack 15 may be stored in a memory associated with ECU 70, such a temperature frequency may be determined.

Figure 4:
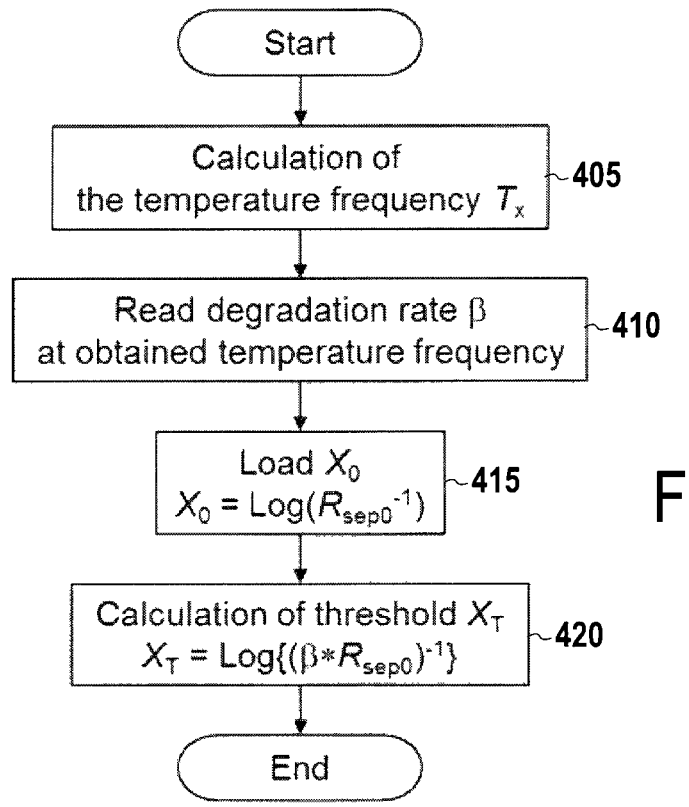
FIG. 4 is a flowchart showing one exemplary method for battery degradation compensation.

FIG. 4 is a flowchart showing one exemplary method for battery degradation compensation for use when determining a threshold separator impedance $X_T$. According to embodiments of the disclosure, a temperature frequency to which the battery pack 15 has been exposed over its lifetime is calculated (step 405).

Figure 6:
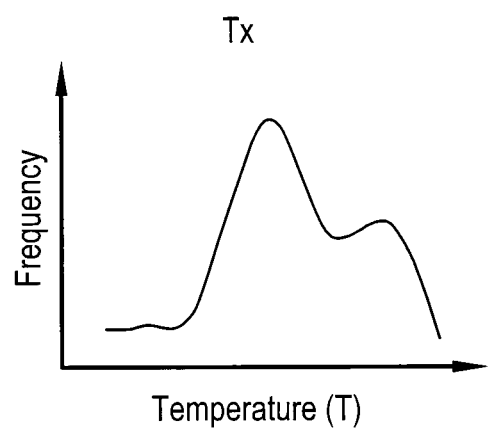
FIG. 6 shows an exemplary and schematic diagram of a determined temperature/frequency distribution of a battery.

FIG. 6 shows an exemplary schematic diagram of a determined temperature/frequency distribution of a battery cell. In the diagram the x-axis represents the temperature T of the battery cell 10 and the y-axis represents a frequency, i.e., the inverse of time t. In other words, FIG. 6 contains the accumulated temperature data of the battery pack 15 over its entire life time, i.e. over the whole time battery pack 15 has been in use and the storage times between the usage, this data being stored, for example, in the memory by battery ECU 70.

In order to establish the data for a battery pack 15, i.e. corresponding to the illustrated curve, it is determined for each temperature to which battery pack 15 was exposed during its life time, e.g. from −40° C. to +60° C. in (quantized) steps of 1° C., how much time the battery pack 15 spent at such temperature. The accumulated time in the chart is thereby expressed by its inverse, i.e. by a frequency.

One of skill in the art will recognize that the temperature of each battery pack 15 should approximately correspond to that each battery cell 10, so that their degradation is the approximately identical.

Figure 7:
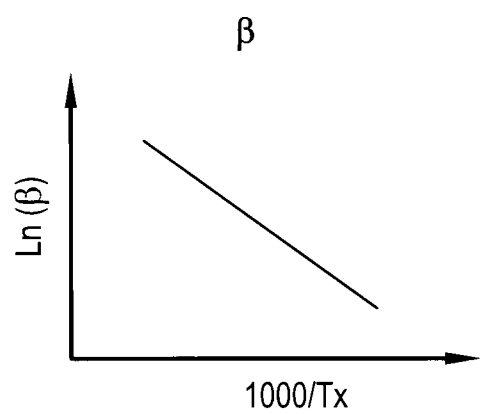
FIG. 7 shows an exemplary and schematic diagram of a predetermined degradation rate in relation to the temperature of a battery.

Once the temperature frequency of the battery has been determined, a degradation rate β can be determined based on a data map as shown at FIG. 7 (step 410).

Importantly, a degradation rate β depends on the temperature frequency $T_x$ and is predetermined and specific for the type of the battery cells 10 comprising battery pack 15, which preferably corresponds to the type of the battery pack 15 (e.g., solid state lithium ion). The degradation rate β is preferably determined in pre-experiment and is stored by the battery (in case of a smart battery) and/or by the battery ECU 70. An exemplary data map is shown at FIG. 7.

A method for plotting the map of FIG. 7 is discussed below.

Prior to placing a battery in service, an initial separator impedance $R_{sep\_initial}$ of an exemplary battery may be measured and the value stored.

The exemplary battery may then be placed in a temperature controlled chamber and subjected to varying temperatures over varying time periods. The temperature frequency can then be calculated by equation 2.

$$T_x = \frac{1}{t}\int_t^1 T(t)dt \qquad (2)$$

The impedance of the exemplary battery may then be measured following the exposure to the varying temperatures, and a temperature adjusted impedance $R_{sep}(T_x)$ determined and the value stored.

The degradation rate can then be calculated at a given temperature frequency $T_x$ based on equation 3.

$$\beta = R(Tx)/R_{initial} \qquad (3)$$

The data map shown at FIG. 7 can then be created plotting Plot the $(1000/T_x, β)$ on the graph of $1000/T_x$ vs $\ln(β)$.

Once the temperature frequency of the battery has been mapped, a degradation rate β for a particular temperature frequency can be determined based on the data map as shown at FIG. 7 (step 410).

Once a degradation rate β has been determined for a particular temperature frequency $T_x$ associated with the in-service battery pack 15, an initial corrected impedance $X_{initial}$ may be loaded from a data map, as described below.

Figure 5:
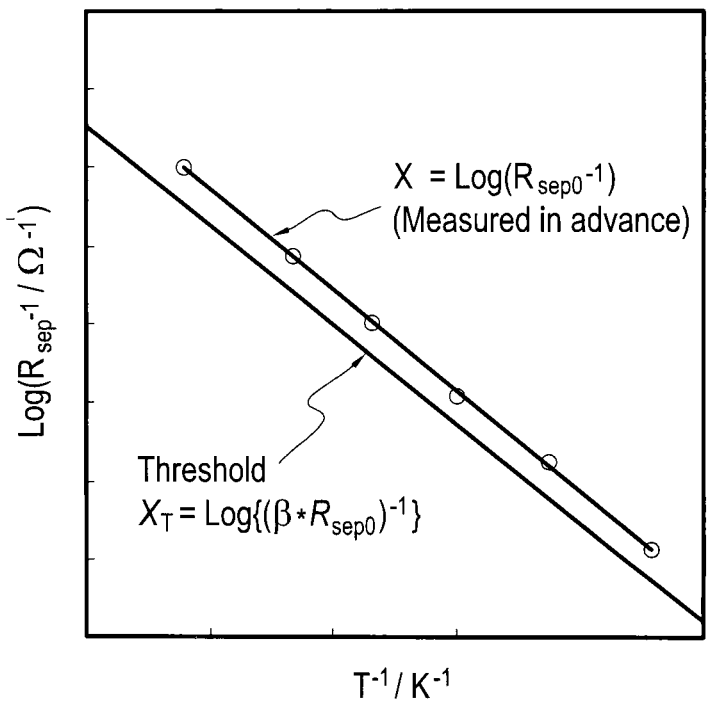
FIG. 5 is a graph representing an initial impedance of a battery and determination of a degradation compensated threshold impedance.

FIG. 5 is a graph representing an initial impedance $X_{initial}$ of a battery and determination of a degradation compensated threshold impedance $X_T$. As noted above, an initial impedance $R_{sep\_initial}$ for a new exemplary battery is measured over a range of temperatures and a data map correlating initial impedance $R_{sep\_initial}$ to an initial resistance value $X_{initial}$ is created using equation 4 to account for the correlation to temperature (i.e., Arrhenius law).

$$X_{initial} = \log(R_{sep\_initial}^{-1}) \qquad (4)$$

In order to determine the relevant point on the initial impedance map, it is possible to load, from the data map, an initial corrected impedance $X_{initial}$ (step 415).

Once the initial corrected impedance $X_{initial}$ has been determined, the threshold impedance XT may be determined using equation 5 (step 420).

$$X_T = \log\{(\beta * R_{sep\_initial})^{-1}\} \qquad (5)$$

Figure 3B:
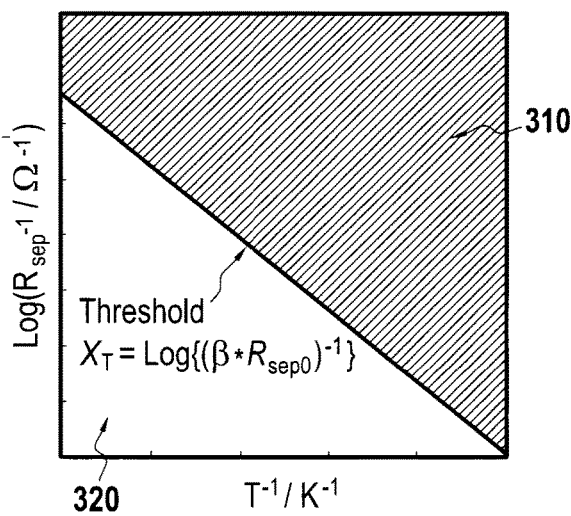
FIG. 3B is graph showing an impedance region in which a battery is permitted to operate and a shaded impedance region in which operation of the battery should be prevented.

As shown at FIG. 5 (and FIG. 3B), using this equation produces an operating region 320 in which a battery pack 15 is permitted to operate by battery controller 20, and a micro-short region 310, in which battery controller 20 is configured to prevent operation of battery pack 15.

By calculating a impedance delta ΔX according to equation 6 (step 230), it then becomes possible to evaluate whether the impedance delta ΔX is less than 0 (i.e., in the micro-short region 310) (step 240: yes) so that battery operation may be stopped (step 250) and an alert sent (step 260). Notably, stopping of operation may include preventing current flow to and from battery pack 15, while an alert may comprise a sound, a visual effect, or any other suitable warning to an operator of a vehicle that battery pack 15 may be failing or inoperable.

$$\Delta X = X_T - X \qquad (6)$$

When the impedance delta ΔX is greater than or equal to 0 (step 240: no) battery controller may allow battery pack 15 to continue to operate, i.e., current to flow to and from battery pack 15.

Throughout the description, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

It is intended that the specification and examples be considered as exemplary only, with a true scope of the disclosure being indicated by the following claims.

The invention claimed is:

1. A system for determining a condition of a battery, comprising:

a temperature sensor configured to provide a temperature value associated with the battery;

an impedance sensor configured to provide impedance information associated with the battery; and a controller configured to:
- determine a threshold impedance associated with a separator membrane of the battery based on an initial impedance of the separator membrane as measured by the impedance sensor and a battery temperature as measured by the temperature sensor, the initial impedance being measured in advance over a range of temperatures for a given equilibrium constant to generate values that are stored in a data map;
- monitor, during operation of the battery, an actual impedance associated with the separator membrane of the battery based on the impedance information and the battery temperature;
- permit current flow to and from the battery when the actual impedance is greater than the threshold impedance; and
- prevent current flow to and from the battery when the actual impedance is less than or equal to the threshold impedance.

2. The system according to claim 1, wherein the impedance information comprises an impedance spectrum.

3. The system according to claim 1, wherein the threshold impedance is further determined based on the values stored in the data map.

4. The system according to claim 3, wherein the controller is configured to account for degradation of the battery based at least on a temperature frequency of the battery.

5. The system according to claim 4, wherein the threshold impedance is reduced based on a degradation coefficient.

6. The system according to claim 5, wherein the degradation coefficient is determined in advance by measuring degradation of an exemplary battery under exemplary use conditions, and at a plurality of temperature frequency values, the measured degradation being correlated to temperature frequency in a data map.

7. The system according to claim 1, wherein the battery comprises at least one of a lithium-ion solid-state battery and a lithium-ion liquid electrolyte battery.

8. A vehicle comprising the system according to claim 1.

9. A method for controlling a battery, comprising:
- determining a battery temperature;
- determining a threshold impedance associated with a separator membrane of the battery based on an initial impedance of the separator membrane and the battery temperature, the initial impedance being determined from an impedance spectrum at a point where an impedance measurement crosses a real axis;
- monitoring, during battery operation, an actual impedance associated with the separator membrane of the battery based on the impedance information and the battery temperature;
- permitting current flow to and from the battery when the actual impedance is greater than the threshold impedance; and
- preventing current flow to and from the battery when the actual impedance is less than or equal to the threshold impedance.

10. The method according to claim 9, further comprising measuring the initial impedance in advance over a range of temperatures for a given equilibrium constant, and storing the measured values in a data map.

11. The method according to claim 10, wherein the threshold impedance is further determined based on the values stored in the data map.

12. The method according to claim 11, comprising accounting for degradation of the battery based at least on a temperature frequency of the battery.

13. The method according to claim 12, wherein the threshold impedance is reduced based on a degradation coefficient.

14. The method according to claim 13, wherein the degradation coefficient is determined in advance by measuring degradation of an exemplary battery under exemplary use conditions, and at a plurality of temperature frequency values, the measured degradation being correlated to temperature frequency in a data map.

15. The method control system according to claim 9, wherein the battery comprises at least one of a lithium-ion solid-state battery and a lithium-ion liquid electrolyte battery.

16. A system for determining a condition of a battery, comprising:

a temperature sensor configured to provide a temperature value associated with the battery;

an impedance sensor configured to provide impedance information associated with the battery; and a controller configured to:
- determine a threshold impedance associated with a separator membrane of the battery based on an initial impedance of the separator membrane as measured by the impedance sensor and a battery temperature as measured by the temperature sensor, the initial impedance being determined from an impedance spectrum at a point where an impedance measurement crosses a real axis;
- monitor, during operation of the battery, an actual impedance associated with the separator membrane of the battery based on the impedance information and the battery temperature;
- permit current flow to and from the battery when the actual impedance is greater than the threshold impedance; and
- prevent current flow to and from the battery when the actual impedance is less than or equal to the threshold impedance.

* * * * *